United States Patent
Han et al.

(10) Patent No.: US 7,145,491 B2
(45) Date of Patent: Dec. 5, 2006

(54) TIME-INTERLEAVED BAND-PASS DELTA-SIGMA MODULATOR

(75) Inventors: Gun-Hee Han, Goyang (KR); Min-Ho Kwon, Seoul (KR); Jung-Yoon Lee, Seoul (KR)

(73) Assignee: Yonsei University, Seoul (KR)

( * ) Notice: Subject to any disclaimer, the term of this patent is extended or adjusted under 35 U.S.C. 154(b) by 93 days.

(21) Appl. No.: 10/522,373

(22) PCT Filed: Aug. 29, 2002

(86) PCT No.: PCT/KR02/01623

§ 371 (c)(1),
(2), (4) Date: Jan. 18, 2005

(87) PCT Pub. No.: WO2004/030220

PCT Pub. Date: Apr. 8, 2004

(65) Prior Publication Data

US 2005/0231407 A1 Oct. 20, 2005

(30) Foreign Application Priority Data

Aug. 16, 2002 (KR) ............................... 2002-48362

(51) Int. Cl.
*H03M 1/00* (2006.01)

(52) U.S. Cl. ...................................... 341/141; 341/143
(58) Field of Classification Search ................. 341/141
See application file for complete search history.

(56) References Cited

U.S. PATENT DOCUMENTS

| | | | |
|---|---|---|---|
| 5,208,594 A * | 5/1993 | Yamazaki ................. 341/143 |
| 5,345,233 A * | 9/1994 | Nagata et al. ................. 341/76 |
| 6,215,429 B1 * | 4/2001 | Fischer et al. .............. 341/139 |
| 6,825,784 B1 * | 11/2004 | Zhang ......................... 341/131 |

* cited by examiner

Primary Examiner—Rexford Barnie
Assistant Examiner—Joseph Lauture
(74) Attorney, Agent, or Firm—G W i P S

(57) ABSTRACT

A time-interleaved bandpass delta-sigma modulator is developed which includes a first adder and a second adder and a comparator. An input signal is transmitted to the first adder according to the clock frequency of each channel block, and an n channel block output $u_n$ of the first adder is transmitted to the first adder and the second adder of an n+2 channel block, and an n block output $v_n$ of the second adder is transmitted to the second adder of an n+2 block, and an output $y_n$ that passes through an n block comparator is transmitted to the first adder and the second adder of an n+2 block. Therefore, a modulator sequentially receives output from the comparator of each block for generating the final output y.

6 Claims, 7 Drawing Sheets

(a)

(b)

TIME-INTERLEAVED BAND-PASS DELTA-SIGMA MODULATOR

This application is a national stage entry of PCT/KR02/01623 filed Aug. 29, 2002.

BACKGROUND OF THE INVENTION

1. Field of the Invention

The present invention relates to a time-interleaved band-pass $\Delta$-$\Sigma$ modulator (hereinafter, referred to as "a delta-sigma modulator"). More particularly, this invention relates to a delta-sigma modulator including a plurality of channel blocks, of which the phase of the lock frequencies is different from each other, so as to reduce a clock frequency.

2. Related Prior Art

A delta-sigma modulator generally includes a lowpass modulator and a bandpass modulator. The lowpass modulator is used for audio devices, while the bandpass modulator is used for radio communication. The delta-sigma modulator may be composed of a continuous-time circuit or a discrete-time circuit, with reference to FIG. 1a and FIG. 1b. A bandpass delta-sigma modulator in FIG. 1b samples the intermediate-frequency (IF) as many as four times, and removes quantization noise (this is referred to as shaping). In the modulator, because the noise is shaped at the input signal within the desired band, a high signal-to-noise ratio (SNR) can be achieved at the input signal on the desired band.

A bandpass delta-sigma modulator that is implemented by a continuous-time circuit (see FIG. 1a) has an advantage that it can operate in a high frequency band. However, it also has a disadvantage that the user must tune a center frequency. In the case of a bandpass delta-sigma modulator that is embodied by discrete-time circuit as in FIG. 1b, such as a switched capacitor circuit, however accurate and reliable it may be, it cannot be operated on the commonly used high frequency IF band, because it must use a clock frequency four times higher than the input signal.

SUMMARY OF THE INVENTION

This invention has been developed to avoid the drawbacks of the conventional delta-sigma modulator. Therefore, it is an object of the present invention to provide a time-interleaved bandpass delta-sigma modulator which is capable of directly performing analog-to-digital conversion even on the high frequency IF band of radio communication systems, by innovatively relaxing the requirements of clock frequency and settling time.

As such, a main concept of this invention is that it performs the same function as the conventional discrete signal bandpass delta-sigma modulator shown in FIG. 1b. However, it can be constituted by only adders and comparators which include a plurality of channel blocks without delay means ($z^{-2}$ or 2-delay), thereby reducing the requirements of clock frequency and settling time, depending on the number of channel blocks.

FIG. 2a and FIG. 2b show an example of the conventional delta-sigma modulator, modified from the one in FIG. 1b. It is noted that the device in FIG. 2a performs the same function as the device in FIG. 1b, and FIG. 2b is a functional equivalent view compared to FIG. 2a.

In FIGS. 2a and 2b, the input signal x enters a first adder 11. The output u of the first adder 11 is fed back to the first adder 11 through a 2-delay, and enters a second adder 13 through a 2-delay 12. The output v of the second adder 13 is fed back to the second adder 13 through a 2-delay 14, and simultaneously enters a comparator 15. The output y of the comparator 15 is again fed back to the first adder 11 and the second adder 13 through the 2-delays, so that the analog input signal x can be converted to a digital output signal y. However, the conventional delta-sigma modulator must sample the input signal by using a clock frequency four times higher than the input signal, and therefore, it cannot be operated in the commonly used high frequency IF band, which has been discussed above.

To overcome this problem, the delta-sigma modulator of the present invention uses a plurality of channel blocks without the delay means. The channel blocks are included in a dashed box 20 of FIG. 2b without delay means. The clock frequency of the respective channel blocks is reduced in inverse proportion to the number of channel blocks, and the phase difference of the clock frequency becomes 1/5 between every pair of channel blocks. For example, if the number of channel blocks is 5, the clock frequency decreases to 1/5.

Therefore, according to the present invention, an input signal is input to the first adder according to each channel block's clock frequency, and an n channel block's output $u$ of the first adder is input to the first adder and the second adder of an n+2 channel block, and an n block's output $v_n$ of the second adder is input to the second adder of an n+2 block, and an output $y_n$ that passes an n block's comparator is input to the first adder and the second adder of an n+2 block. Therefore, a modulator according to the present invention receives the output of each block's comparator sequentially and makes the final output y, which is analog-to-digital converted output signal. Therefore, supposing the number of channel blocks is N, the phase difference between the n channel block and n+1 channel block is sampled to 1/N of the clock frequency.

BRIEF DESCRIPTION OF THE DRAWINGS

The above and other objects, features and advantages of the present invention will become more apparent from the following description when taken in conjunction with the accompanying drawings, in which.

DETAILED DESCRIPTION OF THE PREFERRED EMBODIMENTS

Preferred embodiments of a time-interleaved delta-sigma modulator according to the present invention will be described below with reference to the accompanying drawings.

Figure 1A:
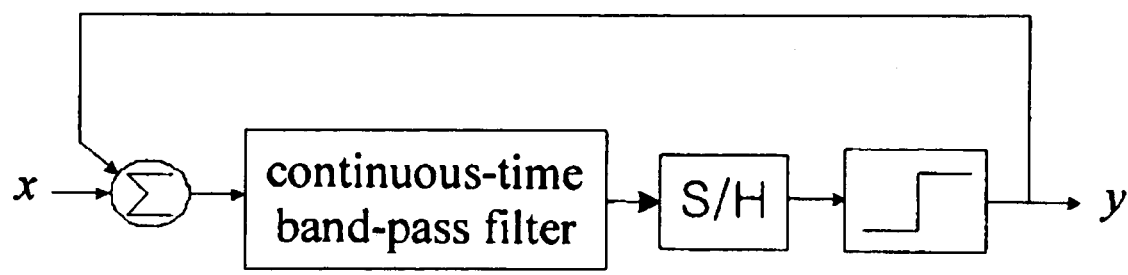
FIGS. 1a and 1b are schematic diagrams of a conventional delta-sigma modulator.
Figure 1B:
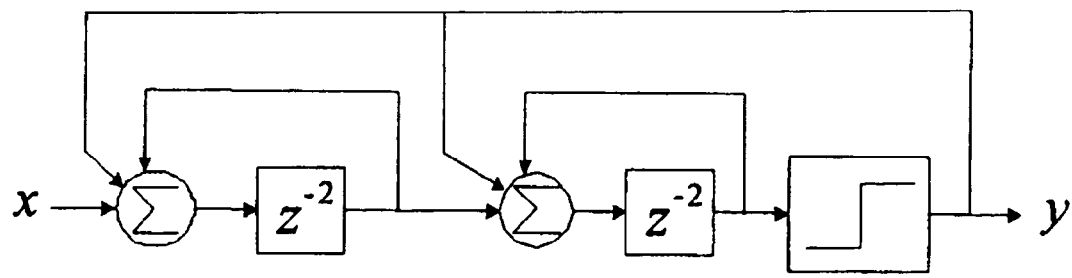
Figure 3:
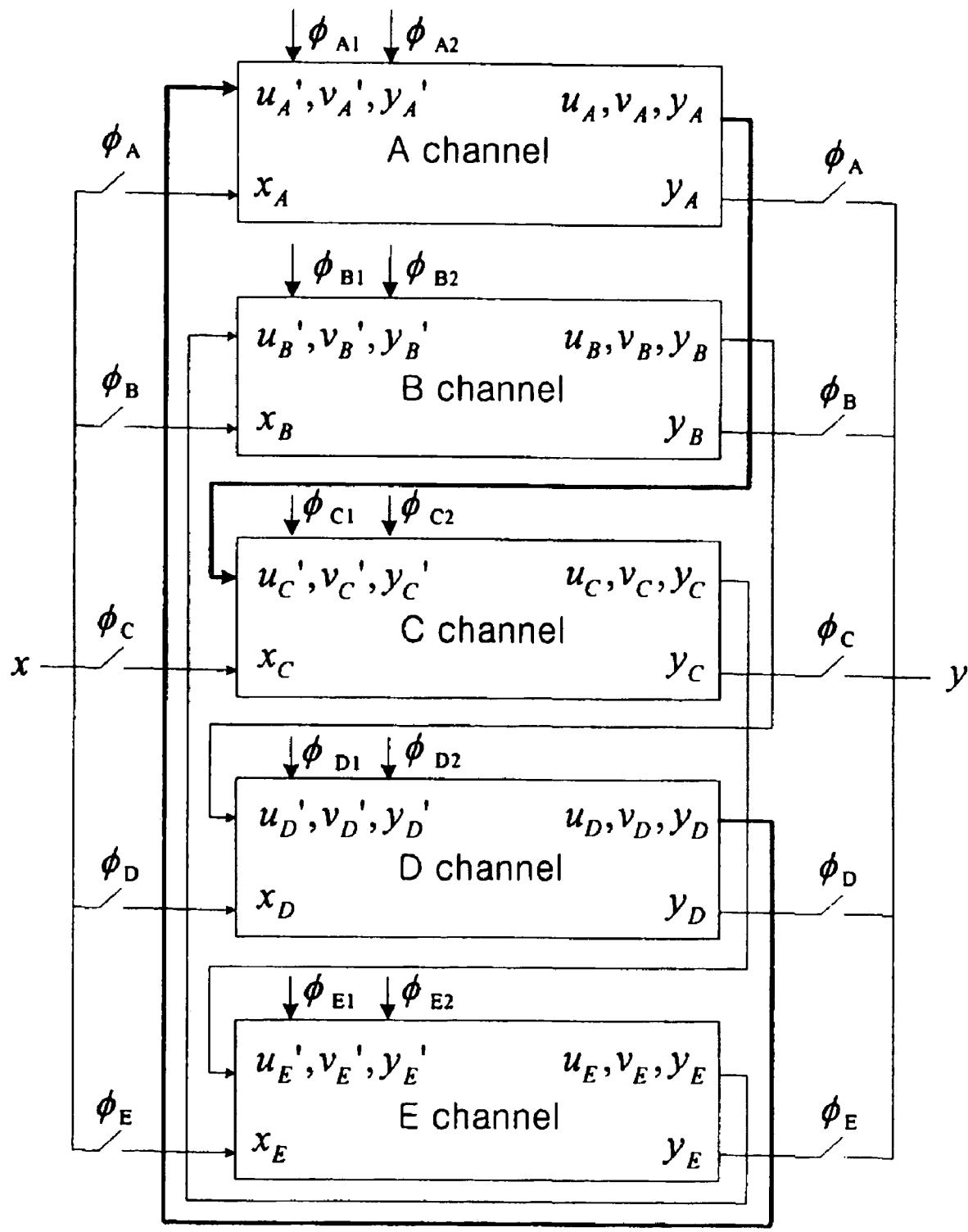
FIG. 3 is a schematic diagram of one embodiment of the present invention.
Figure 4:
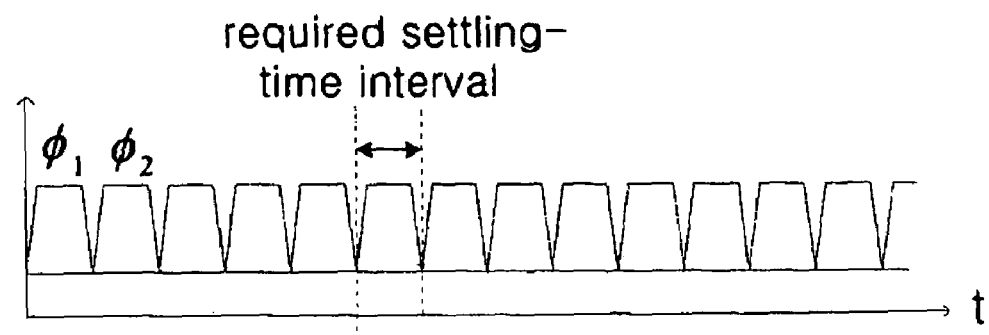
FIG. 4 is a timing diagram of the present invention.
Figure 4:
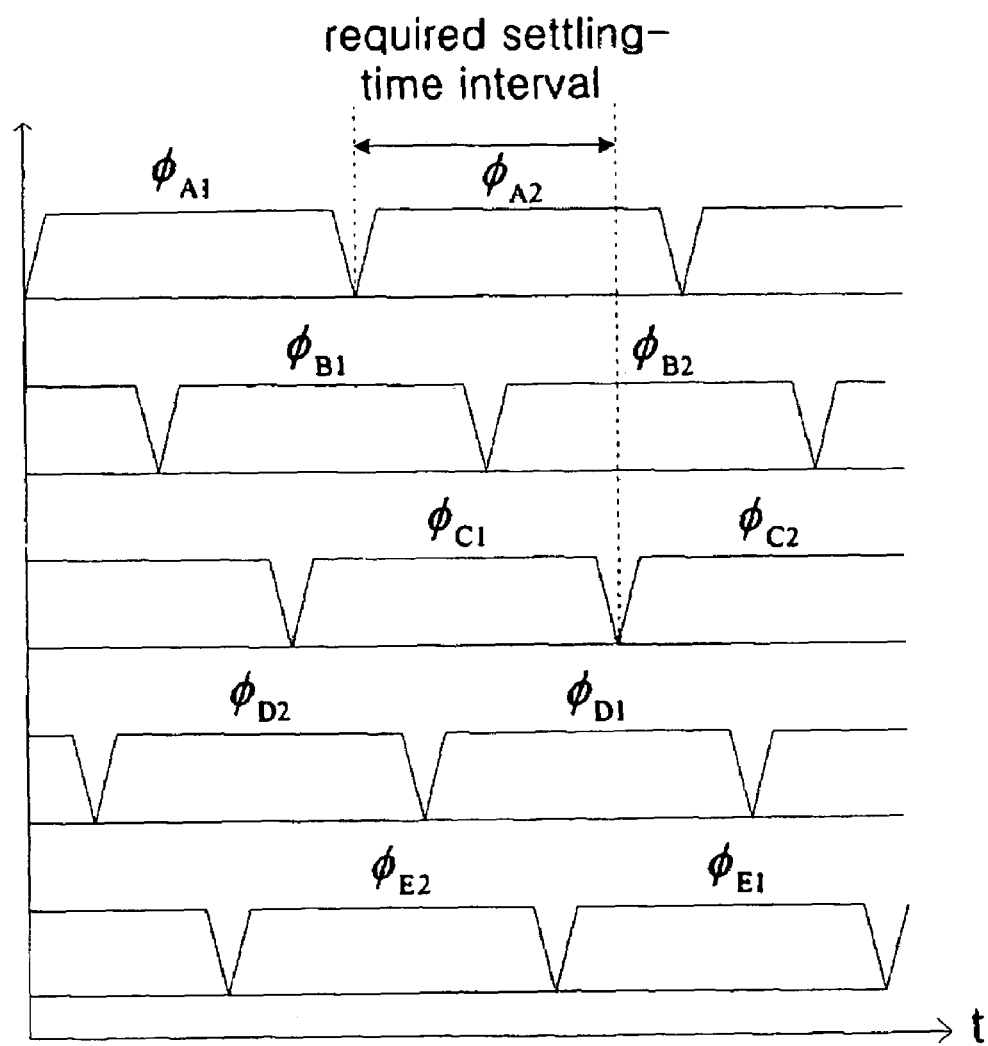
Figure 5:
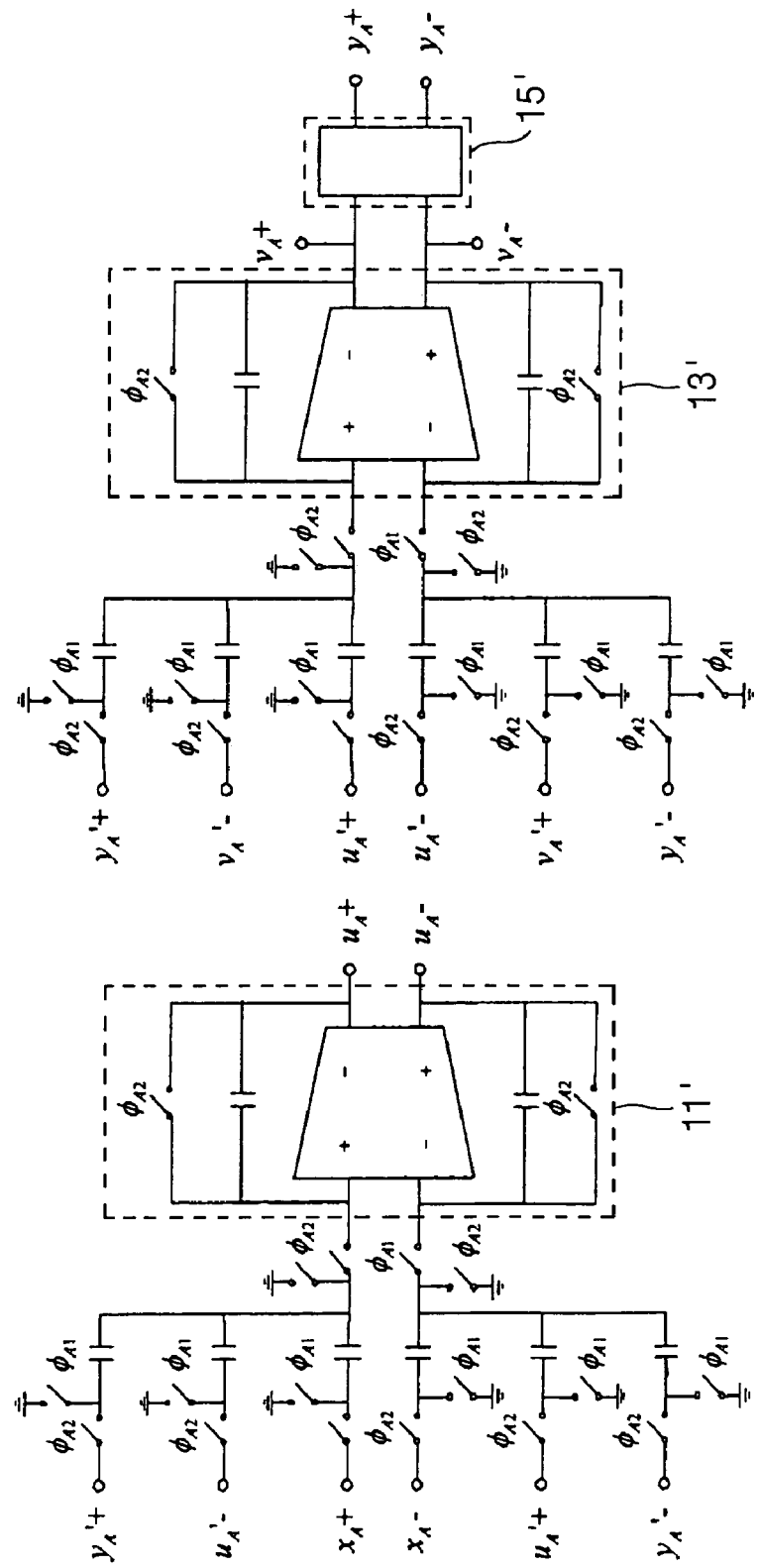
FIG. 5 is a detailed view of a channel A in FIG. 3.

FIG. 3 shows a delta-sigma modulator of the present invention, which is constituted by five channel blocks. FIG. 4(a) is a timing diagram of the conventional delta-sigma modulator shown in FIG. 1b, and FIG. 4(b) is a timing diagram of the delta-sigma modulator of the present invention, shown in FIG. 3. FIG. 5 shows the detailed circuitry of channel A shown in FIG. 3, which is constituted by switched capacitors.

Figure 2A:
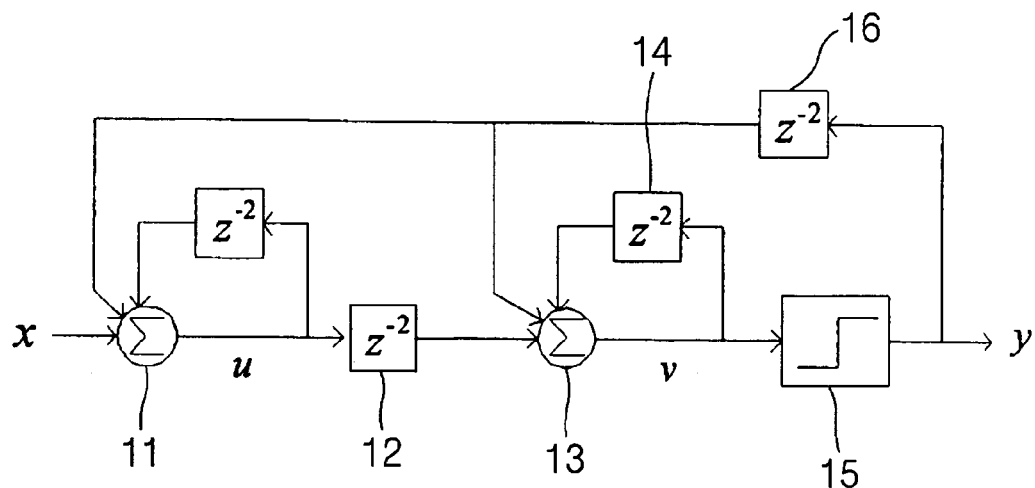
FIGS. 2a and 2b are schematic diagrams modified from FIG. 1b.
Figure 2B:
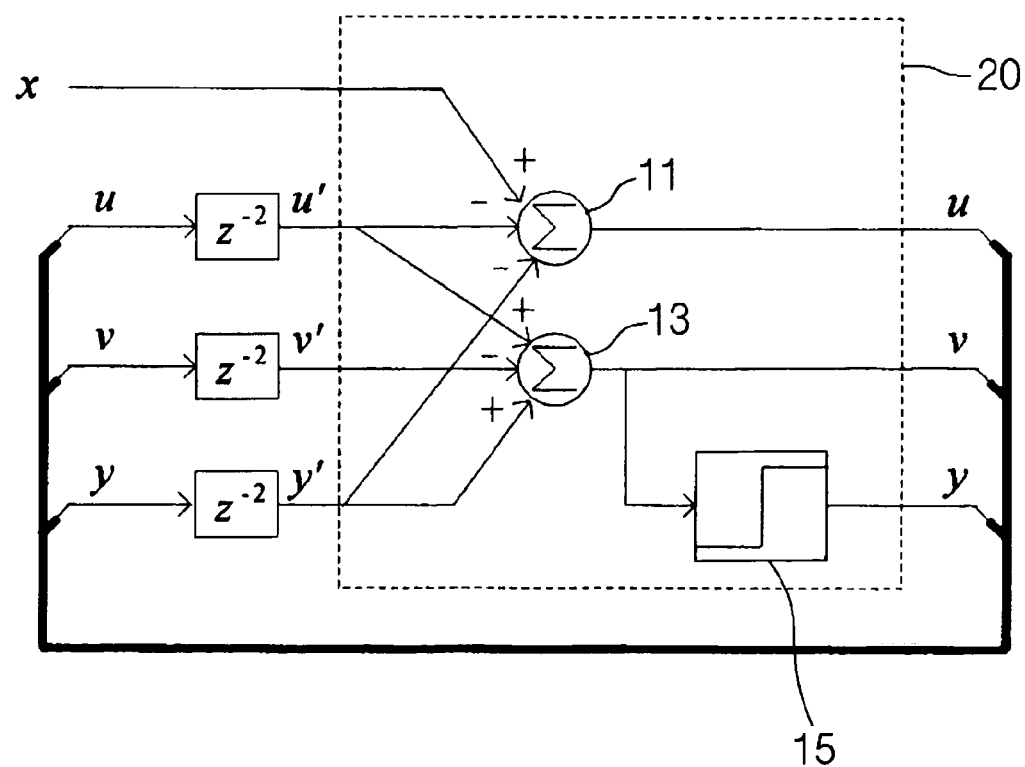

In FIG. 3, each channel block is implemented by a dashed box in FIG. 2b. Also, all of the channel blocks have the same structure, except the phase of the clock frequency. The phase differences of the clock frequency of each channel block are depicted in FIG. 4(b). The phase difference of the clock frequency of the neighboring channel block is 1/5 of a period.

Because of the phase differences, input signals sequentially enter the channel block, and the adder output of the n channel block is changed at $\phi_{n, 2}$. At this time, since the adder output of the n channel block should reach the steady state condition before starting the $\phi_{n+2, 2}$ clock of the n+2 channel block, the required settling time can be reduced to ¼ and the required clock frequency can be reduced to ⅕, compared to a single channel block.

FIG. 5 is a specific circuit diagram of channel block A of the 5-channel block delta-sigma modulator implemented by switched capacitors, which is comprised of a first adder 11', a second adder 13', and a comparator 15'. FIG. 5 shows only one possible example of the present invention, and therefore, the scope of the concept of this invention should not be limited to the diagram shown in FIG. 5.

With reference to FIGS. 3 and 5, the input signal x is sequentially input to the first adder of each channel block, in accordance with the phase of each of the clock frequencies. Then, the output $u_A$ of the first adder 11', the output $v_A$ of the second adder 13', and the output $y_A$ of the comparator 15' are transferred to channel C. That is, the output $u_A$ of the first adder 11' of channel A is input to both the first and the second adder of channel C, the output $v_A$ of the second adder of channel A is input to the second adder of channel C, and the output $y_A$ of the comparator 15' of channel A is input to both the first and the second adders of channel C.

In such a manner, in the case of FIG. 3, the outputs $u_A$, $v_A$, $y_A$ of channel A are input to channel C and the outputs $u_B$, $v_B$, $y_B$ of channel B are input to channel D, channel C to channel E, channel D to channel A, channel E to channel B, etc.

As a result, the output y of the 5-channel-block delta-sigma modulator shown in FIG. 3 is the same as the output of the conventional bandpass delta-sigma modulator shown in FIG. 1b. However, as shown in FIGS. 4(a) and (b), the clock frequency of the 5-channel-block delta-sigma modulator is reduced to ⅕ compared to the conventional single channel block delta-sigma modulator, and the settling time of the 5-channel-block delta-sigma modulator is reduced to ¼ compared to the conventional single channel block delta-sigma modulator. Therefore, the present invention can be implemented on a practical IF band by using switched capacitor circuits.

Although the number of channel blocks has been five (5) so far, it does not need to be limited to this, of course. Designs are possible which implement 7 channel blocks, 9 channel blocks, etc.—odd numbers greater than or equal to five (5). It is noted that a circuit designer should weigh the tradeoffs between decreased clock frequency and settling time and increased circuit complexity as the number of channel blocks increases.

Figure 6A:
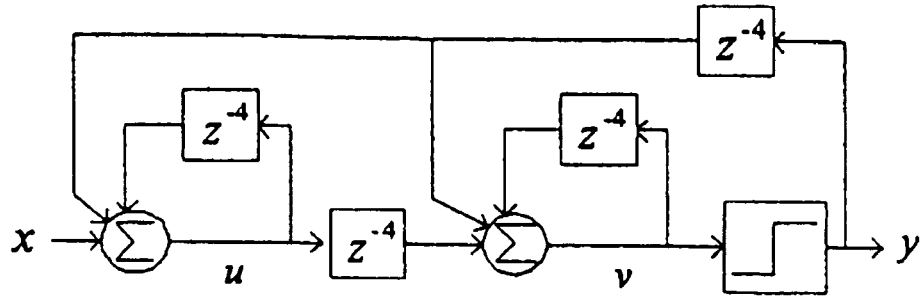
FIGS. 6a–6c show another embodiment of the present invention.
Figure 6B:
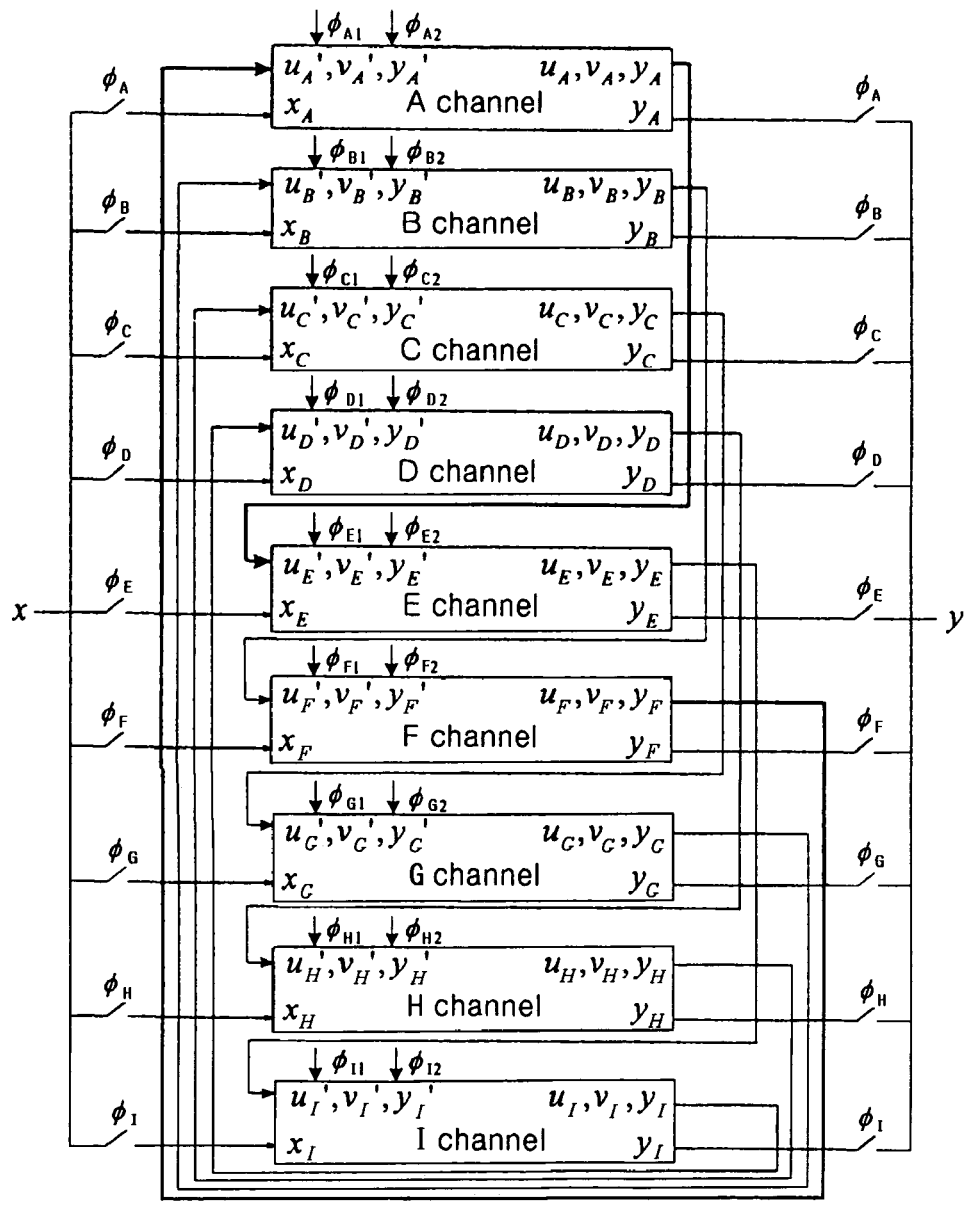

FIGS. 6a and 6b show another embodiment of the present invention, a time-interleaved delta-sigma modulator. In this construction, the outputs $u_n$, $v_n$, $y_n$ of an n channel block are input to an n+3 channel block, in order to implement a 4-delay ($z^{-4}$) instead of a 2-delay as shown in FIG. 2a. In this case, the basic number of channel blocks is nine(9), and this 9-channel-block delta-sigma modulator has a clock frequency ⅑ that of the conventional single channel block delta-sigma modulator, and it has a settling time ⅛ of that of the conventional single channel block delta-sigma modulator. For this embodiment, the number of channel blocks may be selected out of 9, 11, 13, etc.

Figure 6C:
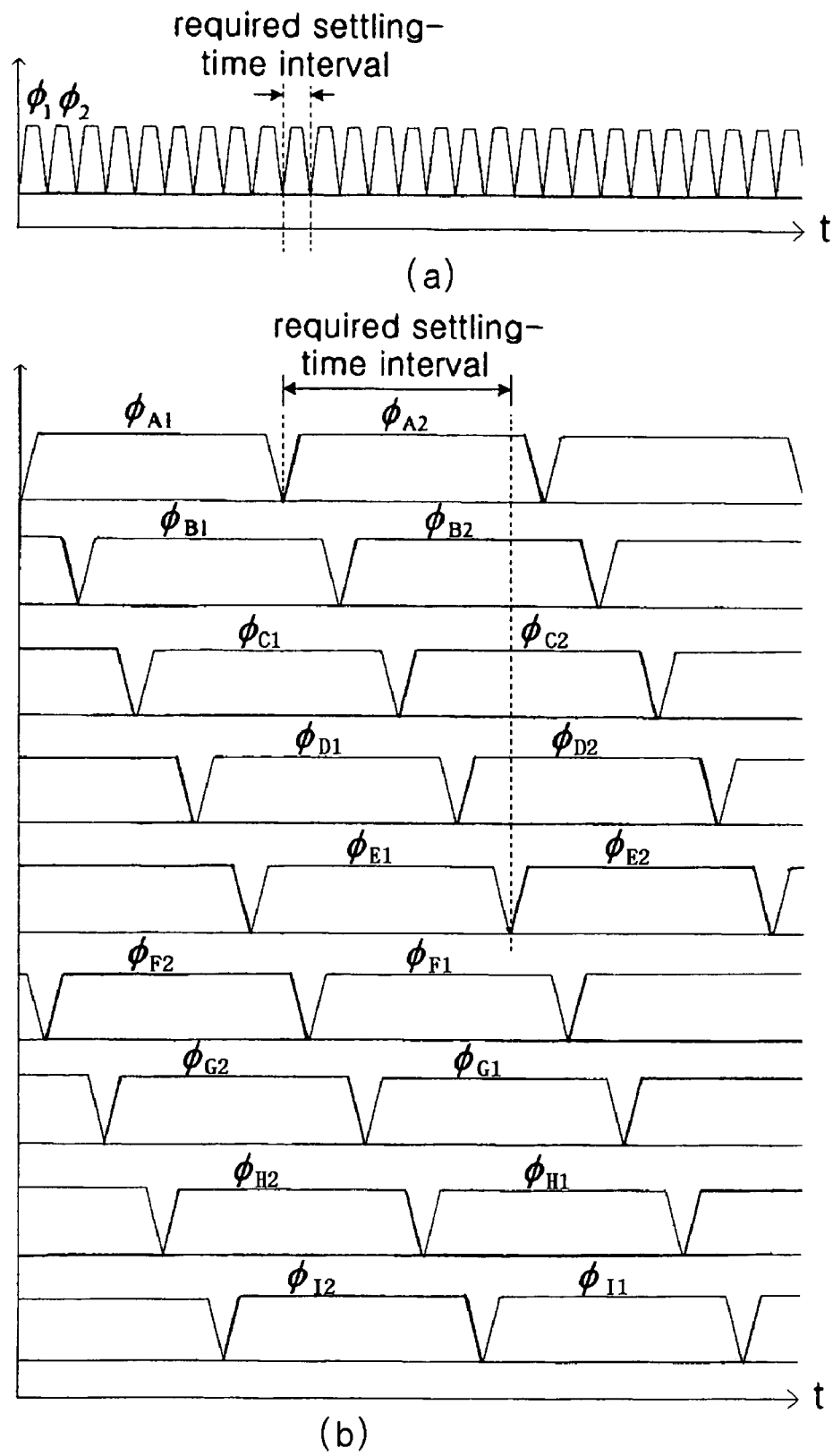

In FIG. 6c, (a) is a timing diagram of a single block delta-sigma modulator, and (b) is a timing diagram of a 4-delay 9-channel-block bandpass delta-sigma modulator. It can be noticed that the clock frequency is reduced to ⅑ and the settling time is reduced to ⅛ compared to the conventional single channel block delta-sigma modulator.

From the foregoing, although a conventional bandpass delta-sigma modulator implemented by switched capacitors cannot be operated on a high frequency IF band, since the clock frequency of the present invention can be significantly reduced, the present invention can effectively perform analog-to-digital conversion even on a high frequency IF band. Therefore, it increases flexibility in a wireless communication system, and reduces the costs.

While the invention has been shown and described with reference to a certain embodiment to carry out this invention, it will be understood by those skilled in the art that various changes in form and details may be made therein without departing from the spirit and scope of the invention as defined by the appended claims.

The invention claimed is:

1. A time-interleaved delta-sigma modulator for converting an analog signal to a digital signal, comprising,
  a plurality of channel blocks, which has different phase of clock frequency, each channel block consisted of a first adder, a second adder, and a comparator,
  wherein, said first adder receives an input signal according to clock frequency of each channel block, and an n channel block output $u_n$ of the first adder is transmitted to the first adder and the second adder of an n+2 channel block, and an n block output $v_n$ of the second adder is transmitted to the second adder of an n+2 block, and an output $y_n$ that passes an n block comparator is transmitted to the first adder and the second adder of an n+2 block, so that said modulator sequentially receiving output from each block comparator for generating a final output y.

2. The time-interleaved delta-sigma modulator of claim 1, wherein a number of said channel blocks have an odd number N greater than or equal to five.

3. The time-interleaved delta-sigma modulator of claim 2, wherein said number of channel blocks is N, a phase difference between the n channel block and n+1 channel block is 1/N times the clock frequency.

4. A time-interleaved delta-sigma modulator for converting an analog signal to a digital signal, comprising,
  a plurality of channel blocks, which has different phase of clock frequency, each channel, block consisted of a first adder, a second adder, and a comparator,
  wherein, said first adder receives an input signal according to clock frequency of each channel block, and an n channel block output $u_n$ of the first adder is transmitted to the first adder and the second adder of an n+4 channel block, and an n block output $v_n$ of the second adder is transmitted to the second adder of an n+4 block, and an output $y_n$ that passes an n block comparator is transmitted to the first adder and the second adder of an n+4 block, so that said modulator sequentially receiving output from each block comparator for generating a final output y.

5. The time-interleaved delta-sigma modulator of claim 4, wherein a number of said channel blocks have an odd number N greater than or equal to nine.

6. The time-interleaved delta-sigma modulator of claim 5, wherein said number of channel blocks is N, a phase difference between the n channel block and n+1 channel block is 1/N times the clock frequency.

* * * * *